United States Patent [19]

Gänswein

[11] Patent Number: 5,474,851
[45] Date of Patent: Dec. 12, 1995

[54] THIN FILM OF GALLIUM OXIDE AND METHOD OF PRODUCING THE FILM

[75] Inventor: Bernhard Gänswein, Aalen-Wasseralfingen, Germany

[73] Assignee: Carl-Zeiss-Stiftung, Heidenheim, Germany

[21] Appl. No.: 206,725

[22] Filed: Mar. 7, 1994

Related U.S. Application Data

[63] Continuation-in-part of PCT/EP93/01692, Jul. 1, 1993.

[30] Foreign Application Priority Data

Jul. 6, 1992 [DE] Germany .......................... 42 22 144.7

[51] Int. Cl.[6] .............................. B32B 15/04; B32B 17/06
[52] U.S. Cl. ......................... 428/432; 428/702; 359/580; 359/586
[58] Field of Search ..................... 428/432, 699, 428/701, 702, 694 DE, 694 XS; 359/577, 580, 581, 586, 588, 589, 368, 362, 656; 427/162, 164, 165, 166, 255.1, 255.2, 255.3

[56] References Cited

U.S. PATENT DOCUMENTS

| | | | |
|---|---|---|---|
| 4,187,336 | 2/1980 | Gordon | 428/34 |
| 4,331,737 | 5/1982 | Nishizawa | 428/457 |
| 4,371,587 | 2/1983 | Peters | 428/446 |
| 4,595,634 | 6/1986 | Gordon | 428/428 |

FOREIGN PATENT DOCUMENTS

| | | |
|---|---|---|
| 56-045092 | 4/1981 | Japan . |
| 1225315 | 9/1989 | Japan . |

OTHER PUBLICATIONS

"CRC Handbook of Chemistry and Physics", 71st edition (1990 to 1991), CRC Press, Boca Raton USA, pp. 4–65.
"Optical Properties of Thin Films of $Ga_2O_3$" by P. Koukal et al. in Scripta Fac. Sci. Not. UJEP Brunensis, Physica 2, vol. 5, (1975), pp. 71 to 82.
"Gallium Oxide Thin Film by Reactive Vapour Deposition", by T. Hariu et al., Japanese Journal Applied Physics, vol. 16, (1977, No. 5, pp. 841 to 842).

Primary Examiner—Donald J. Loney
Assistant Examiner—Leonidas J. Jones, III
Attorney, Agent, or Firm—Walter Ottesen

[57] ABSTRACT

A thin film of gallium oxidized with oxygen is produced by reactive vapor depositing gallium in a vacuum with oxygen followed by tempering. The refractive index (n) lies in the range of 1.2 to 1.3.

6 Claims, 2 Drawing Sheets

THIN FILM OF GALLIUM OXIDE AND METHOD OF PRODUCING THE FILM

RELATED APPLICATION

This is a continuation-in-part application of International patent application PCT/EP93/01692, filed Jul. 1, 1993, and claiming priority of German patent application P 42 22 144.7, filed Jul. 6, 1992.

FIELD OF THE INVENTION

The invention relates to a thin film and a method for producing thin optical films by vapor depositing gallium with oxygen in a vacuum followed by tempering in air.

BACKGROUND OF THE INVENTION

Thin films are routinely used in optics for coating, silvering, as filters and the like and are produced, inter alia, with commercial apparatus by reactive vapor deposition of metals, inter alia, in a vacuum with oxygen or other reactive partners.

Thin films are especially overcoatings of dielectric substances or metals having the thickness of a few molecular layers up to a thickness in the order of magnitude of wavelengths of visible and infrared light.

Japanese patent publication JP 1,225,315 discloses a method for depositing pure gallium on a substrate. Thin films of gallium nitride and gallium arsenide are known but technical applications of gallium oxide are not known.

The reference text "Handbook of Chemistry and Physics", 71st edition (1990 to 1991), CRC PRESS, Boca Raton USA, page 4–65 lists the refractive index of crystalline $Ga_2O_3$ as n=1.92 to 1.95 and for hydrogenated $Ga_2O_3 \cdot H_2O$ as n=1.84. The refractive index of other oxides of gallium is not presented.

The article of Hariu et al published in the Japanese Journal of Applied Physics, Volume 16 (1977), pages 841 and 842, discloses a gallium oxide thin film made by reactive vapor deposition. Gallium is thermally evaporated in an $8 \times 10^{-2}$ Torr oxygen atmosphere. Tempering is performed at 1,000° C. The refractive index is only given for the amorphous as-deposited film (not tempered) to be typically 1.6. Accordingly, no suggestion is provided that a thin film of the outstanding antireflective properties (caused by the index of refraction of 1.2) could be obtained.

SUMMARY OF THE INVENTION

It is an object of the invention to provide a new material for thin films and especially for antireflection films on glass or quartz glass.

According to a feature of the invention, the film comprises gallium oxidized with oxygen. The film is produced by reactive vapor depositing gallium in the presence of oxygen followed by tempering in air.

It has been surprisingly shown that the refractive index of such a thin film is less than the refractive index of conventional optical glass or quartz glass which is in contrast to the value in the literature for solid gallium oxide. The refractive index (n) of the film of the invention lies in the range of 1.2 to 1.3. From this, the special suitability as an antireflective film for glass or quartz glass is derived.

Electron-beam vaporization is especially advantageous for vapor deposition. Optical elements can carry the thin film of the invention individually or in combination with other thin films.

BRIEF DESCRIPTION OF THE DRAWINGS

The invention will now be described with reference to the drawings wherein.

DESCRIPTION OF THE PREFERRED EMBODIMENTS OF THE INVENTION

Conventional plane-parallel plates and wedges made of optical glass BK7 and of quartz glass SUPRASIL are introduced, after conventional cleaning, into a commercial facility for the reactive vapor deposition of thin films utilizing electron-beam deposition in vacuum. Optical glass BK7 is a product of Schott Glaswerke of Mainz, Germany. The wedges and plates are partially covered in order to later have a comparison between coated and uncoated specimens. Conventional metallic gallium (purity better than 99.9%) is introduced into a copper vaporization crucible.

The electron beam vaporization at a vaporization rate of 0.2 nm/s up to a film thickness of 108 nm is carried out at a residual gas pressure of 1.3 to $1.5 \times 10^{-5}$ mbar and at an oxygen pressure of $2.7 \times 10^{-4}$ mbar. The plates and wedges are removed after a cool-down time of 5 minutes and a delay interval of 50 to 100 minutes. Thereafter, the plates and wedges are tempered in air in an oven at 250° C. for approximately 750 minutes.

According to another feature of the invention, the partial pressure in the vacuum is less than $3 \times 10^{-4}$ mbar. Also, the maximum temperature during tempering is so controlled that it does not exceed 300° C.

Figure 1:
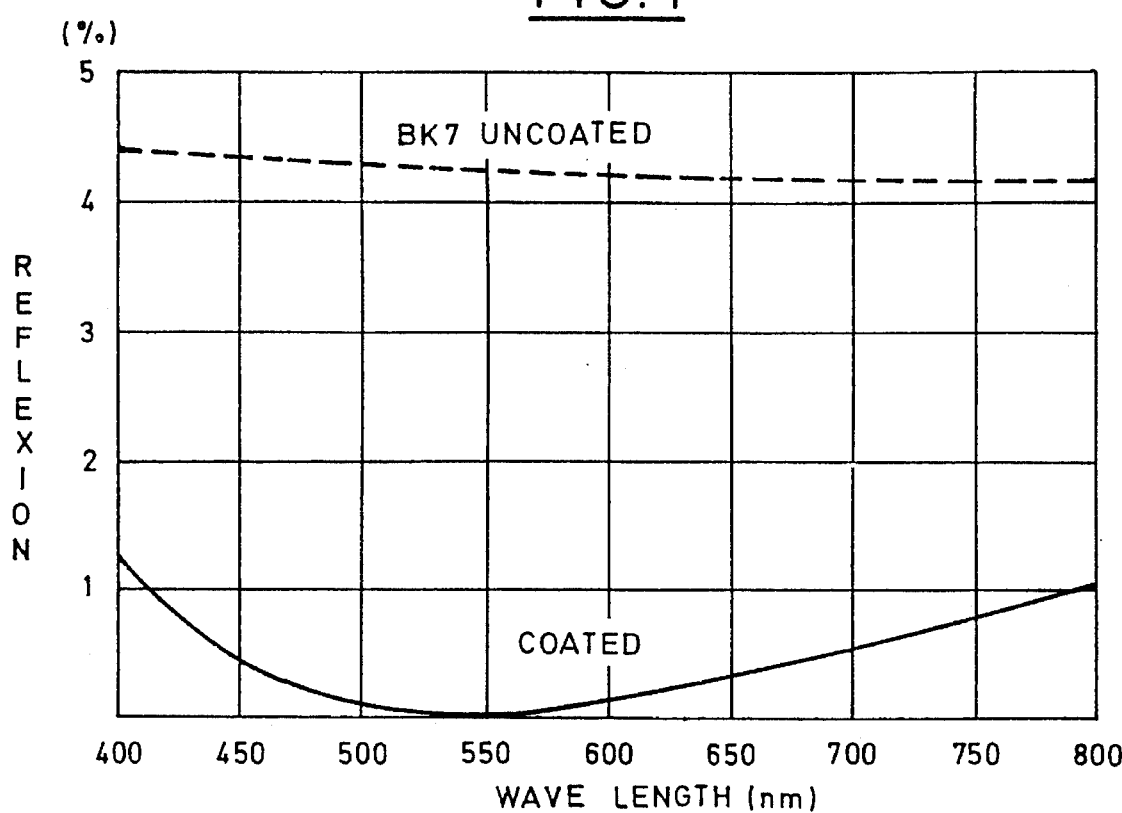
FIG. 1 is a graph showing the spectral reflectivity of a film of the invention on BK7 glass compared to uncoated glass.
Figure 2:
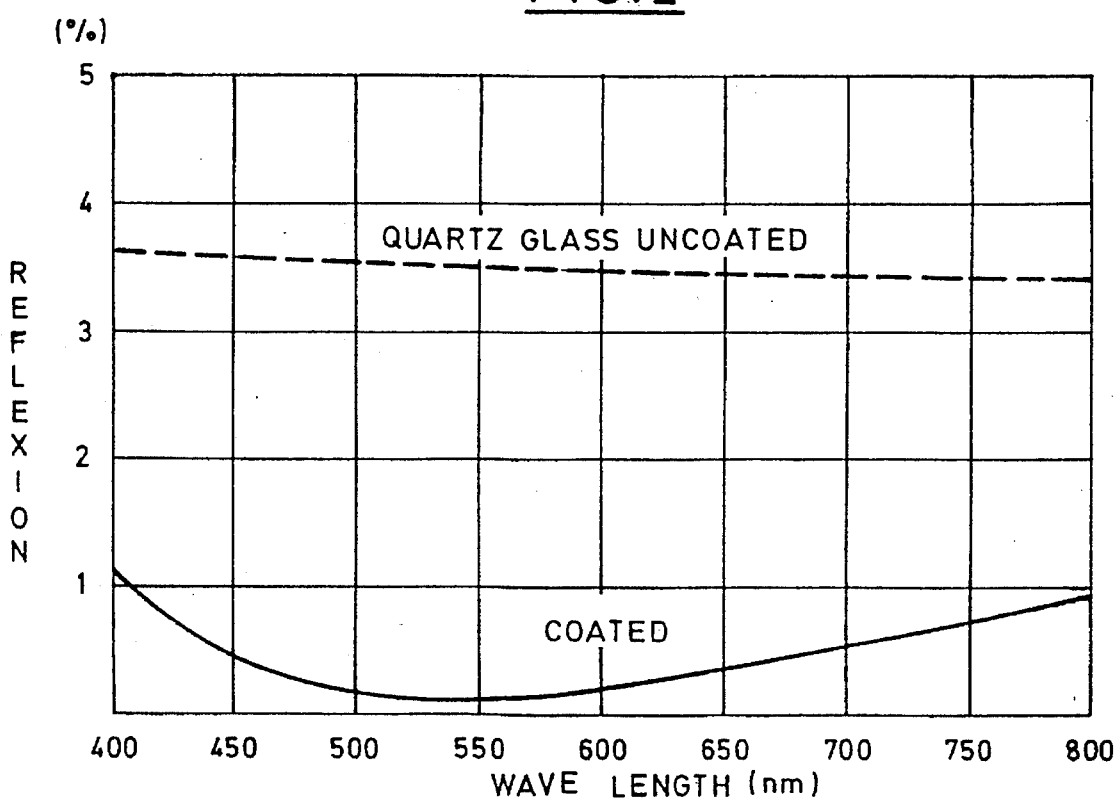
FIG. 2 is a graph showing the spectral reflectivity of a film of the invention on quartz glass compared to quartz glass which has not been treated.

FIGS. 1 and 2 show the trace of the spectral reflectivity for the wedges of glass or quartz glass so treated. These figures also show the trace of the spectral reflectivity compared to the regions of the same wedges to which no film has been applied because of a covering. The reduction of reflection produced by the gallium oxide film is significant in the entire spectral range.

Figure 3:
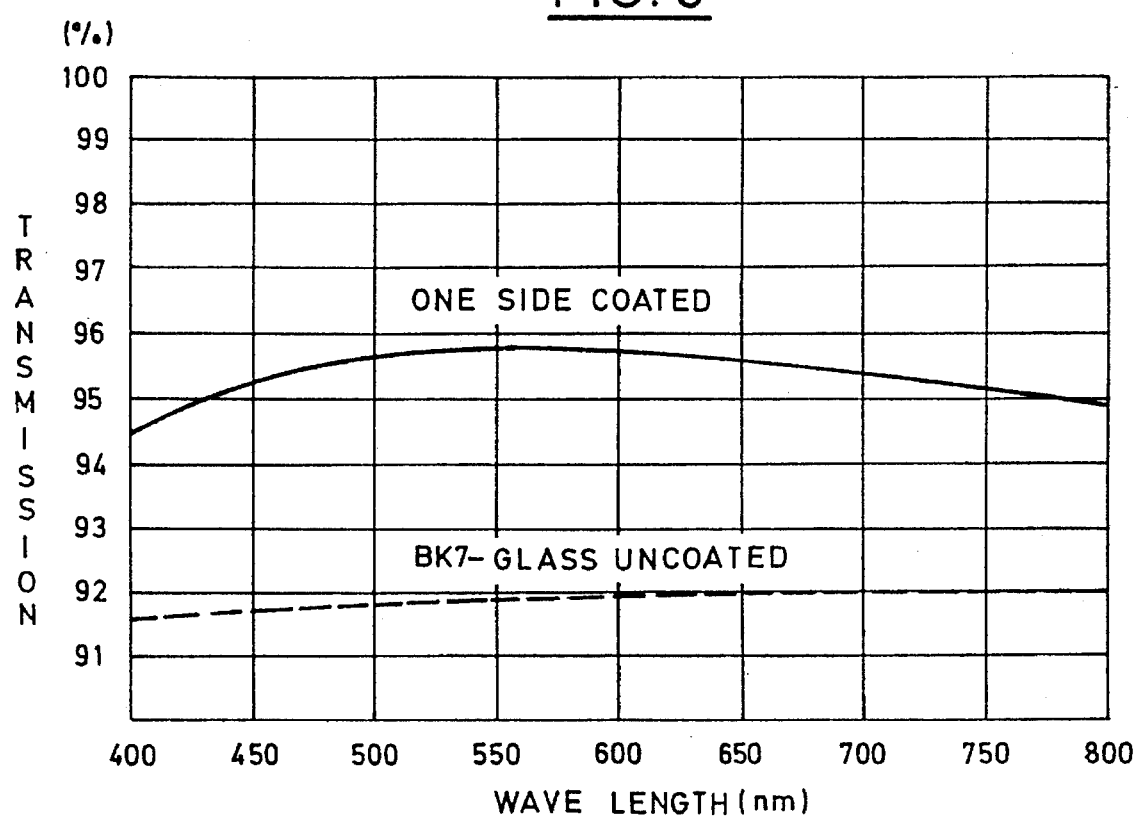
FIG. 3 is a graph showing the spectral transmission capacity of a film of the invention on BK7 glass compared to uncoated glass; and, FIG. 4 is a graph showing the spectral transmission capacity of a film of the invention on quartz glass compared to quartz glass which has not been treated.
Figure 4:
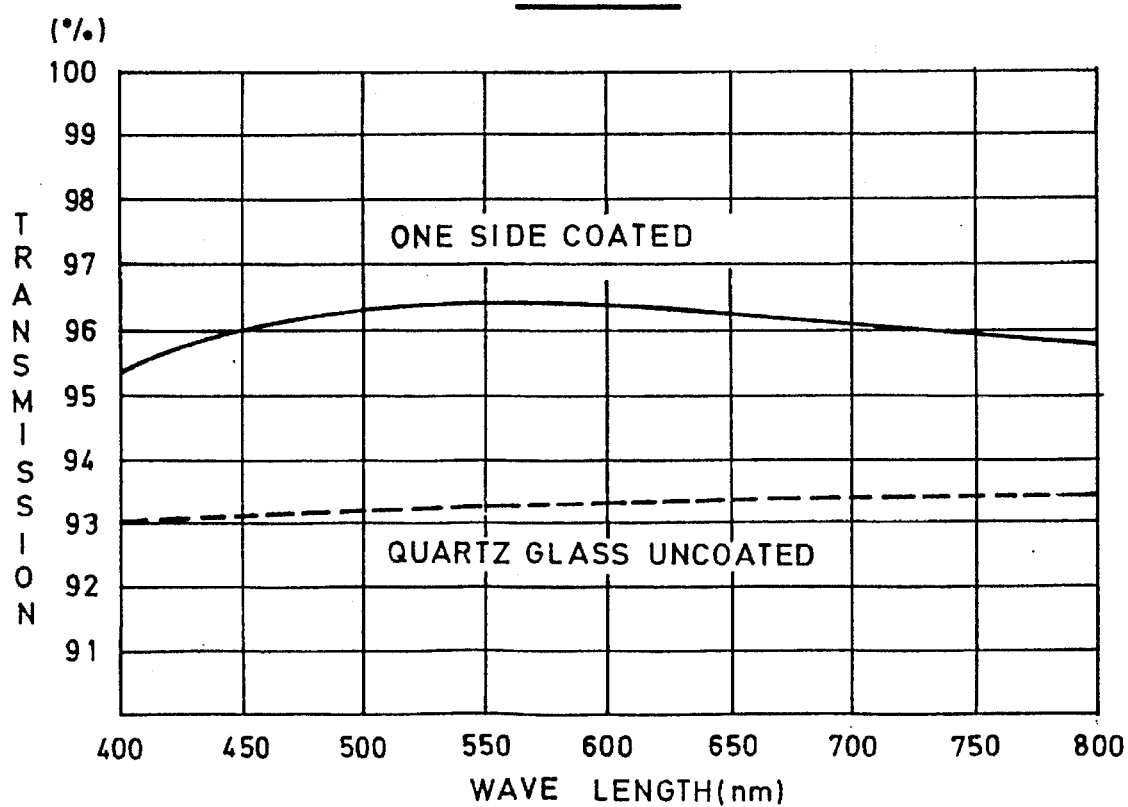

FIGS. 3 and 4 show the corresponding increase of the transmission of the plates where they have been coated with gallium oxide compared to uncoated regions of these plates. The plates are made of glass or quartz glass.

The refractive index of the films of the invention on glass as well as on quartz glass was obtained for both at n=1.23 to n=1.25 from the minimum of the reflection reduction; that is, from the reflection R of the $\lambda/4$-position in accordance with the known formula $$n_{film} = \sqrt{n_{glass} \cdot \frac{1 - \sqrt{R}}{1 + \sqrt{R}}}$$

This value is significantly less than the refractive index $n_{glass}$ of the substrate material and, above all, much less than the refractive index given for gallium oxide as a piece which is greater than 1.8.

Such a difference of the refractive index of thin film with respect to solid pieces does not occur for other conventional materials for thin optical films (for example $MgF_2$).

It has been shown that for the production of thin films according to the invention and made from gallium oxidized with oxygen (the gallium need not be present in stoichiometric form as pure $Ga_2O_3$), no special measures of vaporization technology are required. Rather, only the preparation of gallium as a vaporization material and an atmosphere containing oxygen is important.

The thin films made of oxidized gallium can be applied to substrates and layers conventional in optics and can be covered with the conventional thin films made also of other materials.

The structure of the gallium oxide film is relatively loose and is therefore not completely smudge proof. For this reason, the gallium oxide film is especially suited for coating the inner-lying surfaces of, for example, lenses in complex optical systems such as photographic objectives, microscope optics, et cetera.

It is understood that the foregoing description is that of the preferred embodiments of the invention and that various changes and modifications may be made thereto without departing from the spirit and scope of the invention as defined in the appended claims.

What is claimed is:

1. A composite comprising a glass or quartz glass substrate upon which is disposed an antireflection film, said film comprising gallium oxidized by oxygen and having an index of refraction in the range of 1.2 to 1.3.

2. A composite comprising an optical element, said optical element being a body of solid transparent material upon which is disposed a thin film, said thin film comprising gallium oxidized by oxygen and having an index of refraction in the range of 1.2 to 1.3.

3. The composite of claim 2, wherein said solid transparent material is glass or quartz glass.

4. The composite of claim 2, wherein said optical element is part of a photographic objective or a microscope.

5. The composite of claim 2, wherein said optical element has an interior surface and said film is applied to said interior surface of said optical element.

6. A composite comprising a solid transparent material substrate upon which is disposed a thin film, said thin film comprising at least a two layer film-stack, wherein the improvement comprises one of the at least two layers being gallium oxidized by oxygen and having an index of refraction in the range of 1.2 to 1.3.

* * * * *